(12) United States Patent
Chou (10) Patent No.: US 9,103,606 B2
(45) Date of Patent: Aug. 11, 2015

(54) HEAT DISSIPATING MECHANISM ADAPTED TO AN ELECTRONIC DEVICE AND ELECTRONIC DEVICE THEREWITH

(71) Applicant: Wistron Corporation, New Taipei (TW)

(72) Inventor: Wei-Cheng Chou, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 220 days.

(21) Appl. No.: 13/693,041

(22) Filed: Dec. 4, 2012

(65) Prior Publication Data
US 2013/0213617 A1 Aug. 22, 2013

(30) Foreign Application Priority Data
Feb. 21, 2012 (TW) .............................. 101105604 A (51) Int. Cl.
*F28F 13/12* (2006.01)
*G06F 1/20* (2006.01)
*H01L 23/467* (2006.01)

(52) U.S. Cl.
CPC ............... *F28F 13/12* (2013.01); *G06F 1/203* (2013.01); *H01L 23/467* (2013.01); *H01H 2223/004* (2013.01); *H01L 2924/0002* (2013.01)

(58) Field of Classification Search
CPC ......... H01H 13/06; H01H 9/04; H01H 9/047; H01H 2223/002; H01H 2223/004; F04D 29/403; F04D 29/703; F04D 29/4226; F01D 25/32; F05D 2260/602; F05D 2260/608; G06F 1/203; H01L 23/467; F28F 13/12
USPC ................. 165/80.2, 119, 121; 361/694, 695, 361/679.48, 679.51; 200/302.1, 302.2; 415/169.1, 169.2, 121.2
See application file for complete search history.

(56) References Cited

U.S. PATENT DOCUMENTS

| | | | | |
|---|---|---|---|---|
| 4,490,596 A * | 12/1984 | Hirai et al. | ..................... | 219/623 |
| 6,579,168 B1 * | 6/2003 | Webster et al. | ............... | 454/184 |
| 6,610,944 B2 * | 8/2003 | Lee et al. | .................... | 200/302.1 |
| 7,030,330 B2 * | 4/2006 | Suda | .......................... | 200/302.2 |
| 7,294,800 B2 * | 11/2007 | Koyama | ..................... | 200/302.1 |
| 7,336,489 B1 * | 2/2008 | Chen et al. | ..................... | 361/700 |
| 7,929,301 B2 * | 4/2011 | Fong et al. | ..................... | 361/695 |
| 8,559,173 B2 * | 10/2013 | Fujiwara et al. | ......... | 361/679.48 |
| 2005/0143000 A1 * | 6/2005 | Eisele et al. | .................. | 454/184 |
| 2006/0198104 A1 * | 9/2006 | Chang et al. | .................. | 361/695 |
| 2007/0146988 A1 * | 6/2007 | Yamagishi et al. | ........... | 361/687 |
| 2008/0037205 A1 * | 2/2008 | Arisaka et al. | ................ | 361/680 |
| 2008/0101041 A1 * | 5/2008 | Chang et al. | .................. | 361/728 |
| 2009/0116188 A1 * | 5/2009 | Fong et al. | ..................... | 361/695 |
| 2009/0231807 A1 * | 9/2009 | Bouissiere | .................... | 361/690 |
| 2010/0195282 A1 * | 8/2010 | Lu et al. | ........................ | 361/693 |

* cited by examiner

*Primary Examiner* — M. Alexandra Elve
*Assistant Examiner* — Eric Ruppert
(74) *Attorney, Agent, or Firm* — Winston Hsu; Scott Margo (57) ABSTRACT

A heat dissipating mechanism includes a first housing, a second housing and a tributary hole structure. The first housing is installed on a host casing. At least one inlet and at least one outlet are formed on two sides of the first housing. The second housing combines with the first housing, and the second housing and the host casing form a flow channel for communicating with the at least one inlet and the at least one outlet, so as to guide liquid from the at least one inlet to the at least one outlet. The tributary hole structure is formed on the flow channel and located in a position between the at least one inlet and the at least one outlet. The tributary hole structure is higher than the at least one outlet for guiding air from the at least one inlet to a fan.

16 Claims, 6 Drawing Sheets

HEAT DISSIPATING MECHANISM ADAPTED TO AN ELECTRONIC DEVICE AND ELECTRONIC DEVICE THEREWITH

BACKGROUND OF THE INVENTION

1. Field of the Invention

The present invention relates to a heat dissipating mechanism and an electronic device therewith, and more particularly, to a heat dissipating mechanism capable of enhancing heat dissipating efficiency and preventing internal electronic components from damage resulting from liquids and an electronic device therewith.

2. Description of the Prior Art

Generally speaking, apertures are formed on a notebook computer, such that external air is capable of entering the interior of the notebook computer via the aforesaid apertures. When the notebook computer is in use, a heat dissipating module draws the external air into the notebook computer via the aforesaid apertures, so as to cool internal electronic components of the notebook computer. In practical application, in order to prevent liquids from entering the notebook computer via the aforesaid apertures and thus damaging the internal electronic components, the aforesaid apertures can be disposed on a bottom side or a lateral side of the notebook computer, so as to reduce probability of liquid entrance.

The conventional heat dissipating module utilizes a centrifugal fan to draw the external air in the notebook computer. Since there is a space limitation inside the notebook computer, the aforesaid centrifugal fan is capable of being installed inside the notebook computer with orientation that an inflow face of the centrifugal fan is parallel to a top or a bottom surface of a casing of the notebook computer. Thus, an inflow direction of the inflow face of the centrifugal fan is perpendicular to the top and bottom surface of the casing of the notebook computer. In practical application, when the apertures are disposed with orientation identical to the inflow direction of the centrifugal fan, it results in lowest resistance of flow and best inflow effect. In other words, the apertures are supposed to be disposed on the top and bottom surface of the casing of the notebook computer for achieving the best inflow effect.

However, in consideration that the liquids are easily to enter the notebook computer if the apertures are disposed on the top surface of the casing of the notebook computer, a conventional design is to dispose the apertures on the bottom surface of the casing of the notebook computer. Since the bottom surface of the casing of the notebook computer is close to the desk, the resistance of flow increases correspondingly, so as to reduce the heat dissipating efficiency and further to result in poor operating stability of the notebook computer.

SUMMARY OF THE INVENTION

Thus, the present invention provides a heat dissipating mechanism capable of enhancing heat dissipating efficiency and preventing internal electronic components from damage resulting from liquids and an electronic device therewith for solving above drawbacks.

According to an embodiment, a heat dissipating mechanism adapted to an electronic device is disclosed. The electronic device includes a host casing and a fan installed inside the host casing. The heat dissipating mechanism includes a first housing, a second housing and a tributary aperture structure. At least one inlet and at least one outlet are respectively formed on two sides of the first housing, and the at least one inlet being higher than the at least one outlet. The second housing and the host casing form a flow channel for communicating with the at least one inlet and the at least one outlet, so as to guide liquid from the at least one inlet to the at least one outlet. The tributary aperture structure is formed on the flow channel and located in a position between the at least one inlet and the at least one outlet, and the tributary aperture structure is higher than the at least one outlet for guiding air from the at least one inlet to the fan.

According to another embodiment, the first housing and the second housing form a hollow chamber. The tributary aperture structure is formed on the second housing, so as to communicate with the flow channel and the hollow chamber. The heat dissipating mechanism further includes at least one communicating tube with two ends respectively connected to the second housing and the host casing, so as to communicate with the hollow chamber and a fan containing chamber for containing the fan.

According to another embodiment, the heat dissipating mechanism further includes a plate and at least one connecting structure. The plate is disposed on the host casing. The at least one connecting structure is disposed on the plate and corresponding to the at least one communicating tube, and the at least one connecting structure is connected to the at least one communicating tube.

According to another embodiment, the at least one connecting structure is connected to the at least one communicating tube in a tight-fit manner.

According to another embodiment, the heat dissipating mechanism further includes a screw component for screwing the plate and the host casing.

According to another embodiment, the tributary aperture structure is formed on the host casing for communicating with the flow channel and a fan containing chamber for containing the fan.

According to another embodiment, a sum of cross-sectional area of the at least one outlet is greater than a sum of cross-sectional area of the at least one inlet.

According to another embodiment, the heat dissipating mechanism further includes an assembly screw for screwing the first housing onto the host casing.

According to another embodiment, the second housing is combined with the first housing in a soldering, glued or screwing manner.

According to another embodiment, the first housing and the second housing are integrally formed.

According to another embodiment, an electronic device includes a host casing, a fan and a heat dissipating mechanism. The fan is installed inside the host casing. The heat dissipating mechanism includes a first housing, a second housing and a tributary aperture structure. At least one inlet and at least one outlet are respectively formed on two sides of the first housing, and the at least one inlet being higher than the at least one outlet. The second housing and the host casing form a flow channel for communicating with the at least one inlet and the at least one outlet, so as to guide liquid from the at least one inlet to the at least one outlet. The tributary aperture structure is formed on the flow channel and located in a position between the at least one inlet and the at least one outlet, and the tributary aperture structure is higher than the at least one outlet for guiding air from the at least one inlet to the fan.

When liquids enters the flow channel from the at least one inlet on the first casing, the liquids are guided along the flow channel and exit by the at least one outlet due to a height difference between the tributary aperture structure and the at least one outlet and attraction of gravity. In other words, the liquids can not enter the interior of the electronic device via the tributary aperture structure. Accordingly, the tributary aperture structure of the heat dissipating mechanism of the present invention is capable of preventing the liquids from damaging internal electronic components of the electronic device. On the other hand, when air enters the flow channel from the at least one inlet on the first casing, the air can be drawn by the fan and thus enters the interior of the electronic device via the tributary aperture structure, so as to dissipate heat generated by the running electronic device. In summary, since there is no concern that the liquids enters the interior of the electronic device to damage the internal electronic components thereof from a top surface of the casing, the heat dissipating mechanism of the present invention is capable of disposing the at least one inlet on the top surface of the host casing of the electronic device, so as to enhance the heat dissipating efficiency. Furthermore, the tributary aperture structure is capable of diverging the liquids and the air entering from the at least one inlet on the first casing. Accordingly, it can prevent the liquids from entering the interior of the electronic device and enables the liquids and the air to leave the electronic device by different outlets. In such a manner, the heat dissipating mechanism of the present invention not only enhances the heat dissipating efficiency, but also prevents the liquids from damaging the internal electronic components of the electronic device, so as to improve quality of product.

These and other objectives of the present invention will no doubt become obvious to those of ordinary skill in the art after reading the following detailed description of the embodiment that is illustrated in the various figures and drawings.

DETAILED DESCRIPTION

Figure 1:
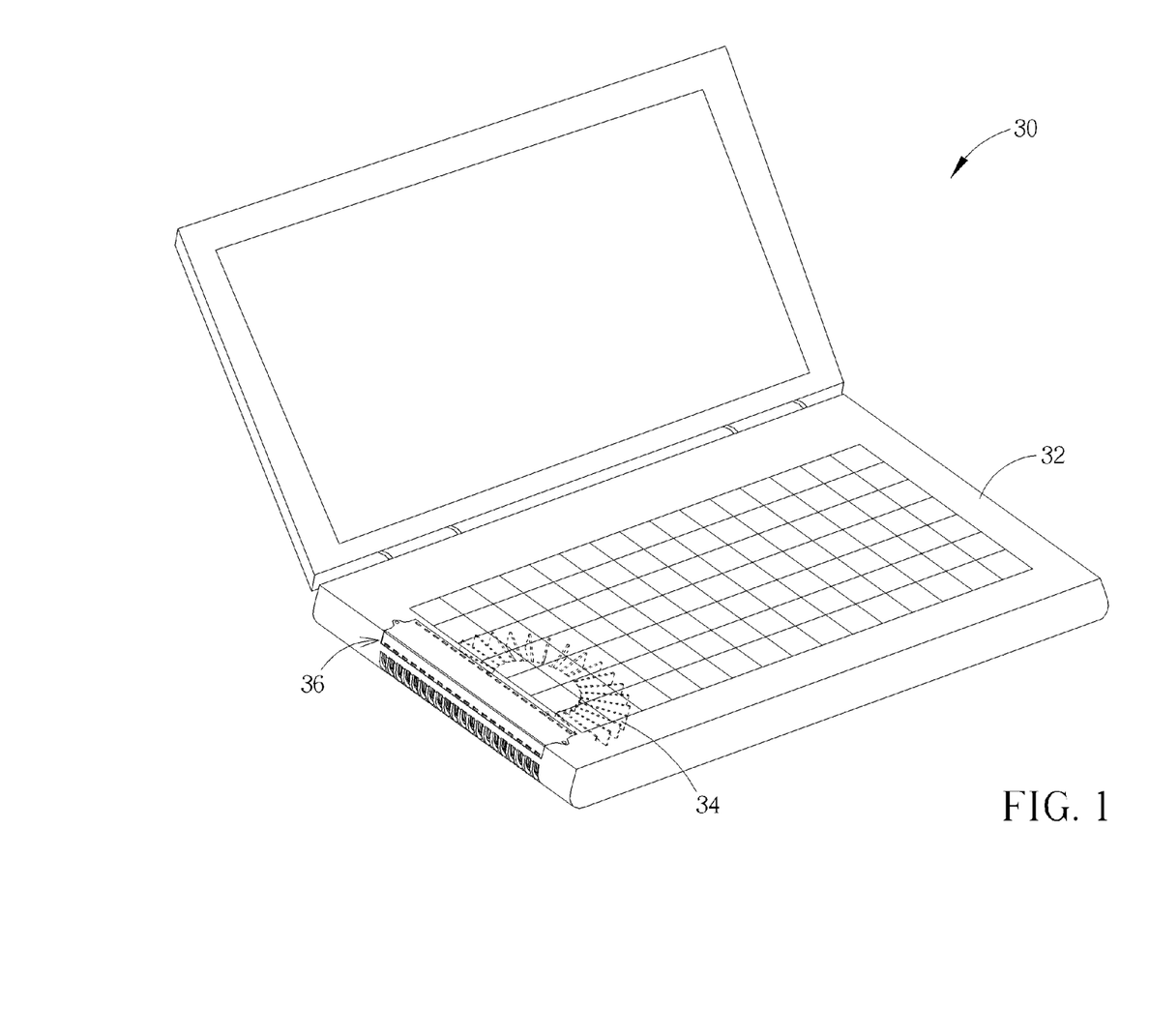
FIG. 1 is a diagram of an electronic device according to an embodiment of the present invention.

Please refer to FIG. 1. FIG. 1 is a diagram of an electronic device 30 according to an embodiment of the present invention. As shown in FIG. 1, the electronic device 30 includes a host casing 32, a fan 34 and a heat dissipating mechanism 36. The host casing 32 covers internal electronic components of the electronic device 30, such as a main board and so on. The fan 34 is installed inside the host casing 32. When the electronic device 30 is in use, the fan 34 and the heat dissipating mechanism 36 are cooperatively used for dissipating heat generated by the running internal electronic components disposed inside the host casing 32 of the electronic device 30. In this embodiment, the electronic device 30 can be, but not limited to, a notebook computer. For example, the electronic device 30 can also be a desktop computer, a projector, a digital TV box and so on.

Figure 2:
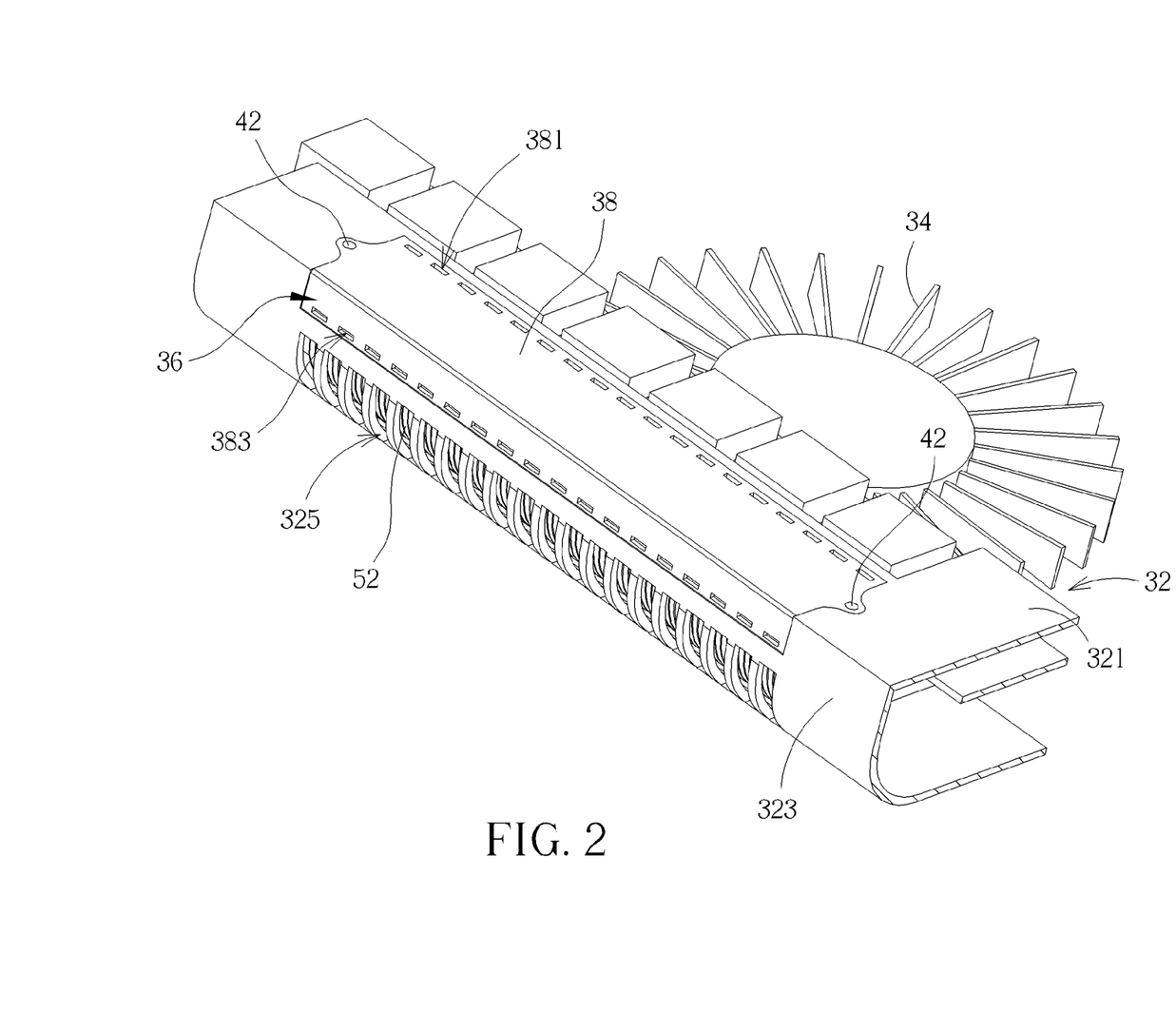
FIG. 2 is a diagram of a partial host casing and a heat dissipating mechanism according to the embodiment of the present invention.
Figure 3:
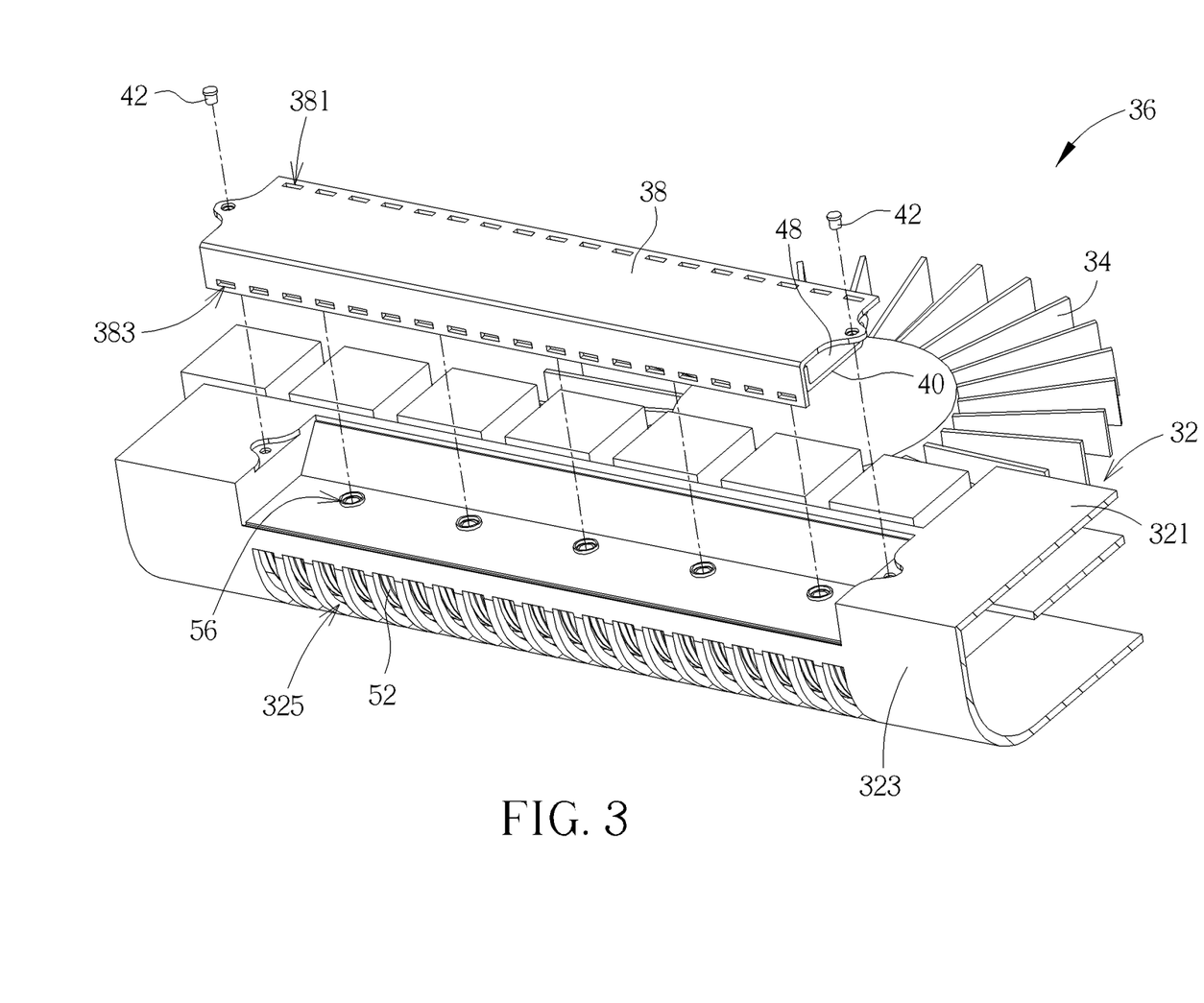
FIG. 3 is an exploded diagram of the partial host casing and the heat dissipating mechanism according to the embodiment of the present invention.

Please refer to FIG. 2 and FIG. 3. FIG. 2 is a diagram of the partial host casing 32 and the heat dissipating mechanism 36 according to the embodiment of the present invention. FIG. 3 is an exploded diagram of the partial host casing 32 and the heat dissipating mechanism 36 according to the embodiment of the present invention. As shown in FIG. 2 and FIG. 3, the heat dissipating mechanism 36 includes a first housing 38 and a second housing 40. The first housing 38 is installed on the host casing 32, and the second housing 40 is combined with the first housing 38. In this embodiment, the second housing 40 can be combined with the first housing 38 in a soldering, glued or screwing manner. Mechanisms for combining the second housing 40 and the first housing 38 are not limited to those mentioned above. For example, the first housing 38 and the second housing 40 can be integrally formed by insert molding. In other words, the mechanisms capable of combining the first housing 38 and the second housing 40 are within the scope of the present invention.

In addition, the heat dissipating mechanism 36 further includes two assembly screws 42 for screwing two sides of the first housing 38 onto the host casing 32, such that the first housing 38 is fixed onto two corners of the host casing 32, as shown in FIG. 1 and FIG. 2. An amount and disposal positions of the assembly screws 42 are not limited to those mentioned in this embodiment, and it depends on practical demands. As shown in FIG. 2 and FIG. 3, a plurality of inlets 381 and a plurality of outlets 383 are respectively formed on two sides of the first housing 38. An amount of the inlet 381 and an amount of the outlet 383 are not limited to those mentioned in this embodiment, and it depends on practical demands. For example, the first housing 38 can include only one inlet 381 and only one outlet 383 as well. In other words, the structures of the heat dissipating mechanism 36 with at least one inlet 381 and at least one outlet 383 are within the scope of the present invention.

Figure 4:
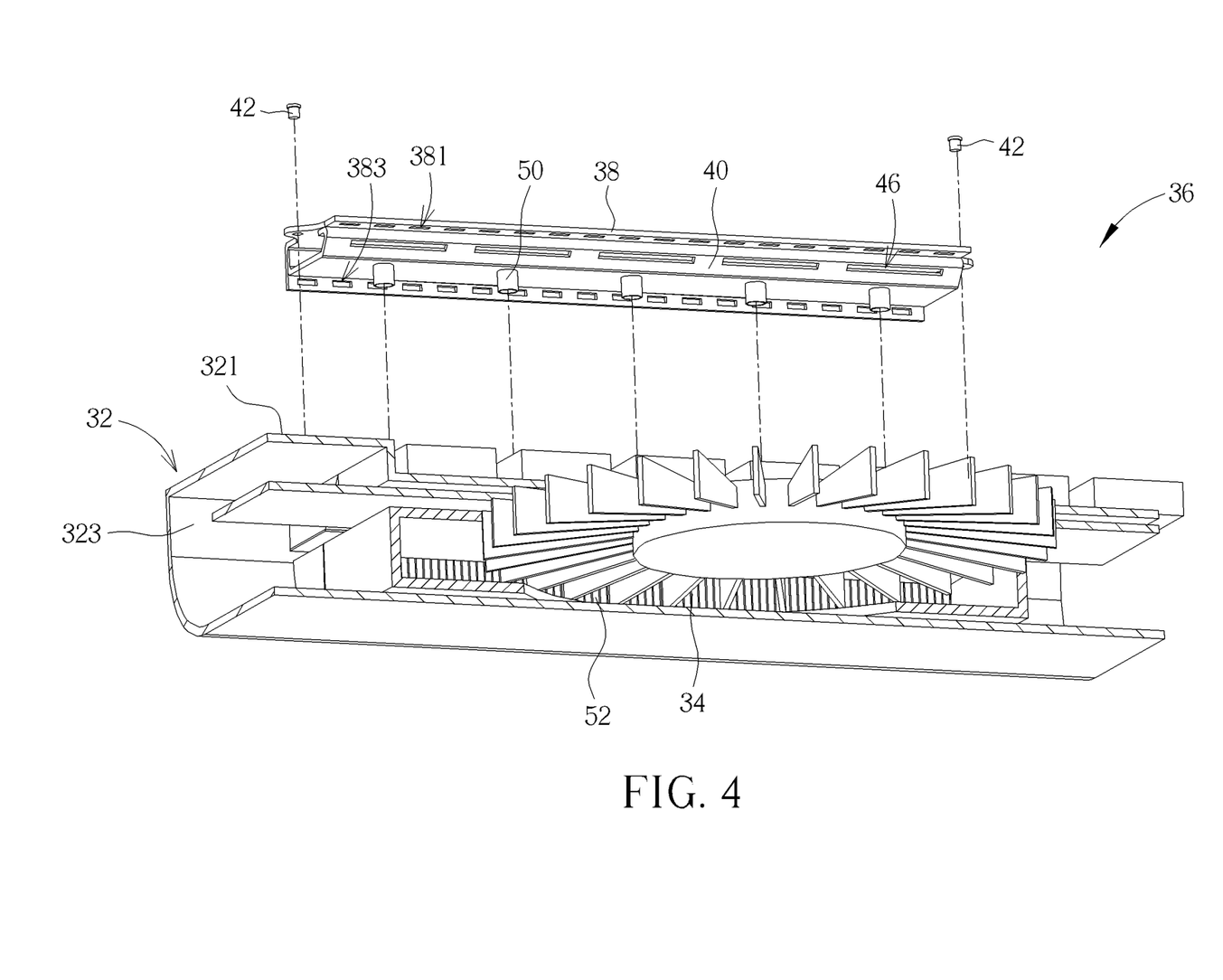
FIG. 4 is an exploded diagram of the partial host casing and the heat dissipating mechanism in another view according to the embodiment of the present invention.
Figure 5:
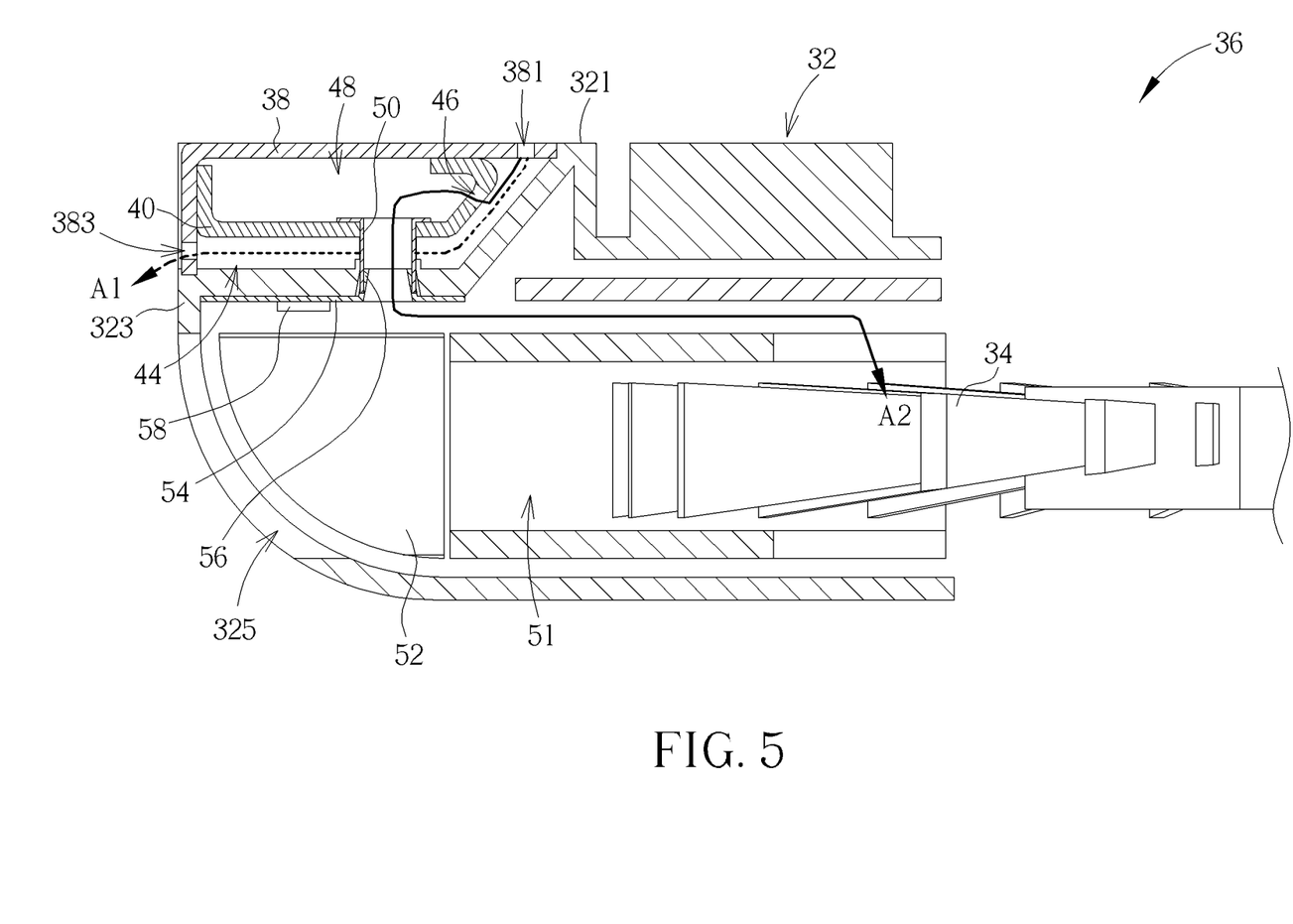
FIG. 5 is a sectional diagram of the partial host casing and the heat dissipating mechanism according to the embodiment of the present invention.

Please refer to FIG. 2 to FIG. 5. FIG. 4 is an exploded diagram of the partial host casing 32 and the heat dissipating mechanism 36 in another view according to the embodiment of the present invention. FIG. 5 is a sectional diagram of the partial host casing 32 and the heat dissipating mechanism 36 according to the embodiment of the present invention. As shown in FIG. 2 to FIG. 5, the inlets 381 are higher than the outlets 383, and the second housing 40 and the host casing 32 form a flow channel 44 for communicating with the inlets 381 and the outlets 383. As mentioned above, the inlets 381 can be located in a position corresponding to a top surface 321 of the host casing 32, and the outlets 383 can be located in a position corresponding to a lateral wall 323 of the host casing 32. Accordingly, when the electronic device 30 is in use and a user carelessly spills a container with liquids, such as water, coffee and so on, the liquids can enter the flow channel 44 from the inlets 381 located in the position corresponding to the top surface 321 of the host casing 32. In the meanwhile, the flow channel 44 is capable of guiding the liquids entering from the inlets 381 to the outlets 383, and the aforesaid liquids eventually leave the electronic device 30 by the outlets 383.

In summary, when the liquids enters the flow channel 44 from the inlets 381 on the first housing 38, the aforesaid liquids flow along a bottom of the flow channel 44 due to attraction of gravity. Accordingly, the liquids can be guided in a flow line A1 shown in a dotted line in FIG. 5 from the top surface 321 of the host casing 32 to the lateral wall 323 of the host casing 32, passing through the inlets 381, the flow channel 44 and the outlets 383 in sequence. In such a manner, the aforesaid liquids can leave the electronic device 30 from the lateral wall 323 of the host casing 32 and do not enter the electronic device 30, so as to prevent the liquids from damaging the internal electronic components of the electronic device 30.

It should be noticed that a sum of cross-sectional area of the outlets 383 can be greater than a sum of cross-sectional area of the inlets 381. As mentioned above, the present invention can ensure that a rate of the liquids for leaving the electronic device 30 is greater than a rate of the liquids for entering the electronic device 30, so as to prevent the liquid from being left inside the host casing 32 of the electronic device 30 and further to prevent the left liquid from damaging the internal electronic components of the electronic device 30.

In addition, the heat dissipating mechanism 36 further includes a tributary aperture structure 46 formed on the flow channel 44 and located in a position between the inlets 381 and the outlets 383. The tributary aperture structure 46 is higher than the outlets 383 on the first housing 38. When the liquids enter the flow channel 44 from the inlets 381, the liquids will flow along the flow channel 44 and leave by the outlets 383 due to a height difference between the tributary aperture structure 46 and the outlets 383 and the attraction of gravity. Accordingly, it can prevent the liquids from entering the interior of the electronic device 30 via the tributary aperture structure 46. In this embodiment, a hollow chamber 48 is formed by the first housing 38 and the second housing 40, and the tributary aperture structure 46 is formed on the second housing 40, so as to communicate with the flow channel 44 and the hollow chamber 48.

Furthermore, the electronic device 30 further includes at least one communicating tube 50 disposed through the flow channel 44. Two ends of each of the communicating tube 50 are respectively connected to the second housing 40 and the host casing 32, so as to communicate with the hollow chamber 48 and a fan containing chamber 51 for containing the fan 34. When the electronic device 30 is in use, the fan 34 can draw air from the inlets 381 on the first housing 38 to the interior of the electronic device 30. In the meanwhile, the air can flows along a flow line A2 shown in solid line in FIG. 5 from the top surface 321 of the host casing 32 to the fan 34, passing through the inlets 381, the flow channel 44, the tributary aperture structure 46, the hollow chamber 48 and the communicating tube 50 in sequence. Afterwards, the fan 34 emits the air to the internal electronic components of the electronic device 30, so as to cool the running internal electronic components of the electronic device 30.

In practical application, the fan 34 can be a centrifugal fan capable of drawing the air from dual sides. In other words, the centrifugal fan is capable of drawing the air from both of a top side and a bottom side of the host casing 32. In other words, an inflow direction of the fan 34 can be substantially perpendicular to the top surface 321 of the host casing 32. Furthermore, since the inlets 381 are located on the position corresponding to the top surface 321 of the host casing 32, it can facilitate the centrifugal fan to draw the air from the top portion. In addition, a normal direction corresponding to an opening of each of the inlets 381 is parallel to the inflow direction of the fan 34. Accordingly, it results in low resistance of flow and better inflow effect. In other words, the aforesaid mechanism can increase quantity of the air which the fan 34 draws from the inlets 381, so as to enhance heat dissipating efficiency of the heat dissipating mechanism 36.

In addition, the heat dissipating mechanism 36 further includes a plurality of thermal fins 52. Each of the thermal fins is disposed on a side of the fan 34 for strengthening heat dissipation of the internal electronic components of the electronic device 30. A plurality of heat dissipating holes 325 is formed on the lateral wall 323 of the host casing 32 for emitting the air drawn by the fan 34 from the inlets 381 into the interior of the electronic device 30 to outside of the electronic device 30, so as to strengthen convection effect and to further enhance the heat dissipating efficiency of the heat dissipating mechanism 36.

As shown in FIG. 3 to FIG. 5, the heat dissipating mechanism 36 further includes a plate 54 and at least one connecting structure 56. The plate 54 is disposed on the host casing 32. The at least one connecting structure 56 is disposed on the plate 54 corresponding to the at least one communicating tube 50. In this embodiment, the heat dissipating mechanism 36 can include five connecting structures 56, as shown in FIG. 3, and five communicating tubes 50, as shown in FIG. 4. An amount and disposal positions of the connecting structure 56 and the communicating tube 50 are not limited to those mentioned in this embodiment. For example, the heat dissipating mechanism 36 can include only one connecting structure 56 and only one communicating tube 50. In other words, the mechanisms of the heat dissipating mechanism 36 with at least one connecting structure 56 and at least one communicating tube 50 are within the scope of the present invention.

Furthermore, each of the connecting structures 56 is connected to the corresponding communicating tube 50, so as to prevent the liquids from entering the interior of the electronic device 30 from a joint between the communicating tube 50 and the host casing 32. In this embodiment, the connecting structures 56 are respectively connected to the communicating tubes 50 in a tight-fit manner. In practical application, the communicating tubes 50 are made in flexible materials, such as rubber materials. The communicating tubes 50 can be connected to the connecting structures 56 more firmly by flexibility of the flexible materials, so as to enhance waterproof effect. The mechanisms for connecting the connecting structures 56 and the communicating tubes 50 are not limited to those mentioned in this embodiment. For example, the connecting structures 56 can respectively be connected to the communicating tubes 50 in a screwing or in an engaging manner as well. As for which one of the aforesaid designs is adopted, it depends on practical demands. In addition, the heat dissipating mechanism 36 further includes a screw component 58 for screwing the plate 54 and the host casing 32, so as to fix the plate 54 on the host casing 32. Mechanisms for fixing the plate 54 on the host casing 32 are not limited to those mentioned in this embodiment. For example, the plate 54 can be fixed on the host casing 32 in a soldering or in a glued manner. As for which one of the aforesaid designs is adopted, it depends on practical demands.

Figure 6:
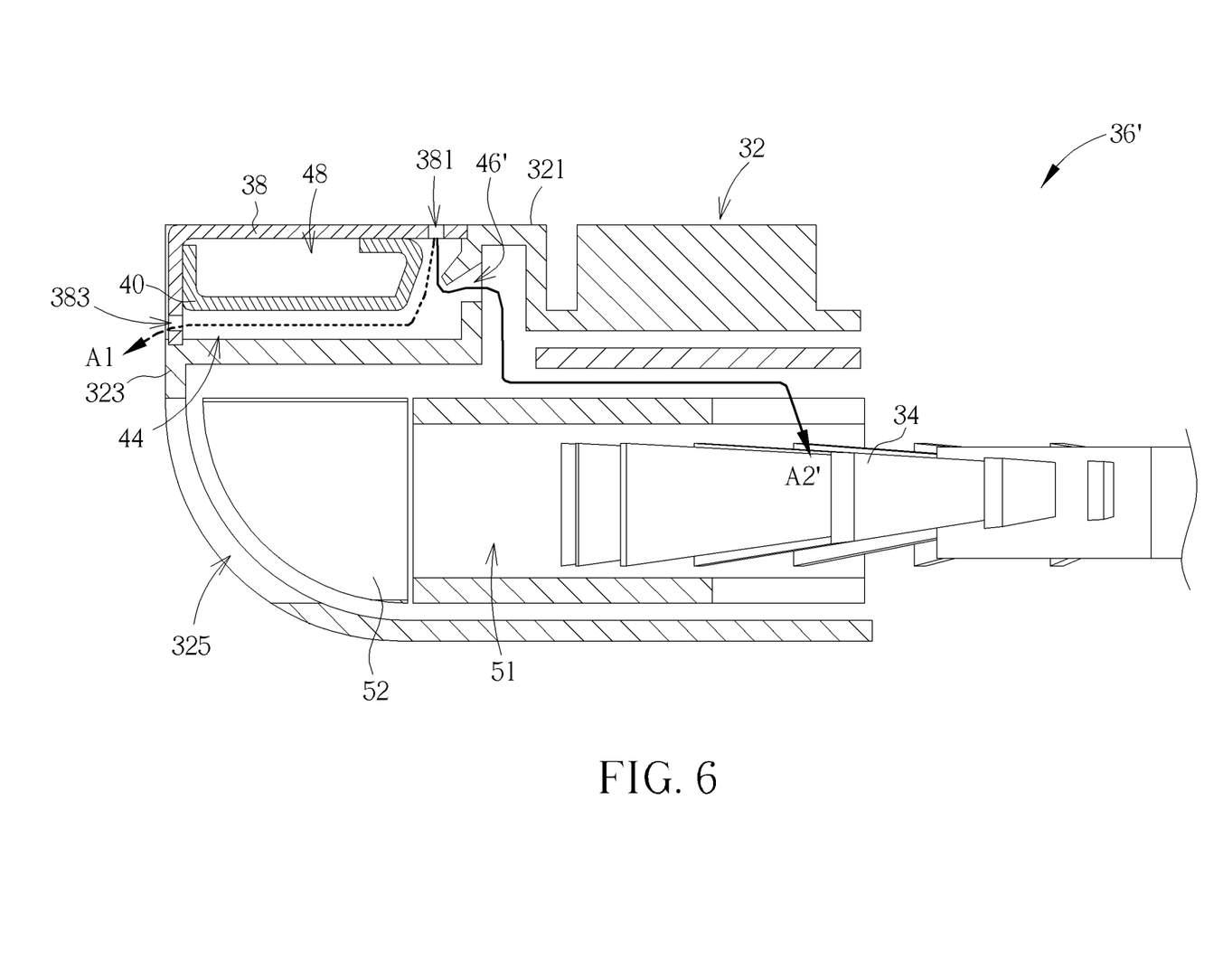
FIG. 6 is a sectional diagram of the partial host casing and a heat dissipating mechanism according to another embodiment of the present invention.

Please refer to FIG. 6. FIG. 6 is a sectional diagram of the partial host casing 32 and a heat dissipating mechanism 36' according to another embodiment of the present invention. As shown in FIG. 6, the major difference between the heat dissipating mechanism 36' and the aforesaid heat dissipating mechanism 36 is that a tributary aperture structure 46' of the heat dissipating mechanism 36' is formed on the host casing 32, so as to communicate with the flow channel 44 and the fan containing chamber 51 for containing the fan 34. When the electronic device 30 is in use, the fan 34 can draw the air from the inlets 381 on the first housing 38 to the interior of the electronic device 30. In the meanwhile, the air can flows along a flow line A2' shown in solid line in FIG. 6 from the top surface 321 of the host casing 32 to the fan containing chamber 51 for containing the fan 34, passing through the inlets 381, the flow channel 44 and the tributary aperture structure 46' in sequence. Afterwards, the fan emits the air to the internal electronic components of the electronic device 30, so as to cool the running internal electronic components of the electronic device 30.

As known by the flow line A2', the air drawn by the fan 34 from the inlets 381 on the first housing 38 neither goes downwards nor passes through the flow channel 44. Accordingly, the communicating tube 50, the plate 54, the connecting structure 56 and the screw component 58 for screwing the plate 54 and the host casing 32 of the heat dissipating mechanism 36' can be omitted. In addition, when the liquids enters the flow channel 44 from the inlets 381 on the first housing 38, the aforesaid liquids flow along the bottom of the flow channel 44 due to the attraction of gravity. Accordingly, the liquids can be guided in a flow line A1 shown in a dotted line in FIG. 6 from the top surface 321 of the host casing 32 to the lateral wall 323 of the host casing 32, passing through the inlets 381, the flow channel 44 and the outlets 383 in sequence. In such a manner, the aforesaid liquids can leave the electronic device 30 from the lateral wall 323 of the host casing 32 and prevent the liquids from entering the electronic device 30. Accordingly it can prevent the liquids from damaging the internal electronic components of the electronic device 30. The tributary aperture structure 46' is higher than the outlets 383 on the first housing 38. When the liquids enter the flow channel 44 from the inlets 381, the liquids will flow along the flow channel 44 and leave by the outlets 383 due to a height difference between the tributary aperture structure 46' and the outlets 383 and the attraction of gravity. Accordingly, it can prevent the liquids from entering the interior of the electronic device 30 via the tributary aperture structure 46'. The components in this embodiment with identical denotes of those in the aforesaid embodiment have the same structures and functions, and further descriptions are omitted herein for simplicity.

Compared to the prior art, when liquids enters the flow channel from the at least one inlet on the first casing, the liquids are guided along the flow channel and exit by the at least one outlet due to a height difference between the tributary aperture structure and the at least one outlet and attraction of gravity. In other words, the liquids can not enter the interior of the electronic device via the tributary aperture structure. Accordingly, the tributary aperture structure of the heat dissipating mechanism of the present invention is capable of preventing the liquids from damaging internal electronic components of the electronic device. On the other hand, when air enters the flow channel from the at least one inlet on the first casing, the air can be drawn by the fan and thus enters the interior of the electronic device via the tributary aperture structure, so as to dissipate heat generated by the running electronic device. In summary, since there is no concern that the liquids enters the interior of the electronic device to damage the internal electronic components thereof from a top surface of the casing, the heat dissipating mechanism of the present invention is capable of disposing the at least one inlet on the top surface of the host casing of the electronic device, so as to enhance the heat dissipating efficiency. Furthermore, the tributary aperture structure is capable of diverging the liquids and the air entering from the at least one inlet on the first casing. Accordingly, it can prevent the liquids from entering the interior of the electronic device and enables the liquids and the air to leave the electronic device by different outlets. In such a manner, the heat dissipating mechanism of the present invention not only enhances the heat dissipating efficiency, but also prevents the liquids from damaging the internal electronic components of the electronic device, so as to improve quality of product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating mechanism adapted to an electronic device, the electronic device comprising a host casing with a heat dissipating hole formed thereon and a fan containing chamber formed therein, the heat dissipating hole communicating with the fan containing chamber, and a fan installed inside the fan containing chamber of the host casing, the heat dissipating mechanism comprising:
    a first housing installed on the host casing, at least one inlet and at least one outlet being formed on two sides of the first housing, the at least one inlet being higher than the at least one outlet, the at least one outlet being oriented on a side whereon the heat dissipating hole is formed;
    a second housing combined with the first housing and located between the first housing and the host casing, the second housing and the host casing forming a flow channel for communicating with the at least one inlet and the at least one outlet so as to guide liquid from the at least one inlet to the at least one outlet, the second housing and the first housing cooperatively encircling a hollow chamber, and the hollow chamber being spaced from the fan containing chamber by the flow channel;
    a tributary hole structure formed on the second housing and located between the at least one inlet and the at least one outlet, the tributary hole structure being higher than the at least one outlet and communicating with the hollow chamber;
    a partition wall formed inside the host casing, the partition wall being located below the second housing and extended into interior of the host casing for separating the at least one outlet and the heat dissipating hole, wherein air drawn by the fan is separated from the liquid discharged via the flow channel and is guided to the heat dissipating hole via the tributary hole structure; and
    at least one communicating tube disposed through the flow channel, two ends of the at least one communicating tube respectively connected to the second housing and the partition wall for communicating with the hollow chamber and the fan containing chamber.

2. The heat dissipating mechanism of claim 1, further comprising:
    a plate disposed on the host casing; and
    at least one connecting structure disposed on the plate and corresponding to the at least one communicating tube, the at least one connecting structure being connected to the at least one communicating tube.

3. The heat dissipating mechanism of claim 2, wherein the at least one connecting structure is connected to the at least one communicating tube in a tight-fit manner.

4. The heat dissipating mechanism of claim 2, further comprising a screw component for screwing the plate and the host casing.

5. The heat dissipating mechanism of claim 1, wherein a sum of cross-sectional area of the at least one outlet is greater than a sum of cross-sectional area of the at least one inlet.

6. The heat dissipating mechanism of claim 1, further comprising:
    an assembly screw for screwing the first housing onto the host casing.

7. The heat dissipating mechanism of claim 1, wherein the second housing is combined with the first housing in a soldering, glued or screwing manner.

8. The heat dissipating mechanism of claim 1, wherein the first housing and the second housing are integrally formed.

9. An electronic device, comprising:
- a host casing whereon a heat dissipating hole is formed, a fan containing chamber being formed in the host casing and communicating with the heat dissipating hole;
- a fan installed inside the fan containing chamber of the host casing; and
- a heat dissipating mechanism, comprising:
  - a first housing installed on the host casing, at least one inlet and at least one outlet being formed on two sides of the first housing, the at least one inlet being higher than the at least one outlet, the at least one outlet being oriented on a side whereon the heat dissipating hole is formed;
  - a second housing combined with the first housing and located between the first housing and the host casing, the second housing and the host casing forming a flow channel for communicating with the at least one inlet and the at least one outlet so as to guide liquid from the at least one inlet to the at least one outlet, the second housing and the first housing cooperatively encircling a hollow chamber, and the hollow chamber being spaced from the fan containing chamber by the flow channel;
  - a tributary hole structure formed on the second housing and located between the at least one inlet and the at least one outlet, the tributary hole structure being higher than the at least one outlet and communicating with the hollow chamber;
  - a partition wall formed inside the host casing, the partition wall being located below the second housing and extended into interior of the host casing for separating the at least one outlet and the heat dissipating hole, wherein air drawn by the fan is separated from the liquid discharged via the flow channel and is guided to the heat dissipating hole via the tributary hole structure; and
  - at least one communicating tube disposed through the flow channel, two ends of the at least one communicating tube respectively connected to the second housing and the partition wall for communicating with the hollow chamber and the fan containing chamber.

10. The electronic device of claim 9, wherein the heat dissipating mechanism further comprises:
- a plate disposed on the host casing; and
- at least one connecting structure disposed on the plate and corresponding to the at least one communicating tube, the at least one connecting structure being connected to the at least one communicating tube.

11. The electronic device of claim 10, wherein the at least one connecting structure is connected to the at least one communicating tube in a tight-fit manner.

12. The electronic device of claim 10, wherein the heat dissipating mechanism further comprises a screw component for screwing the plate and the host casing.

13. The heat dissipating mechanism of claim 9, wherein a sum of cross-sectional area of the at least one outlet is greater than a sum of cross-sectional area of the at least one inlet.

14. The electronic device of claim 9, wherein the heat dissipating mechanism further comprises:
- an assembly screw for screwing the first housing onto the host casing.

15. The electronic device of claim 9, wherein the first housing and the second housing are integrally formed.

16. The heat dissipating mechanism of claim 9, wherein the fan is a centrifugal fan.

* * * * *